United States Patent [19]
Yamada et al.

[11] 4,091,295
[45] May 23, 1978

[54] TRANSISTOR CIRCUIT

[75] Inventors: Hisashi Yamada; Masayuki Katakura, both of Kawasaki, Japan

[73] Assignee: Tokyo Shibaura Electric Co., Ltd., Kawasaki, Japan

[21] Appl. No.: 730,629

[22] Filed: Oct. 7, 1976

[30] Foreign Application Priority Data
Oct. 8, 1975 Japan .................................. 50-120791
Oct. 17, 1975 Japan .................................. 50-124440

[51] Int. Cl.$^2$ ............................................. H03K 17/00
[52] U.S. Cl. .................................... 307/229; 307/254; 328/145
[58] Field of Search ....................... 307/229, 230, 254; 328/145

[56] References Cited
U.S. PATENT DOCUMENTS

| | | | |
|---|---|---|---|
| 3,320,530 | 5/1967 | Pearlman | 328/145 |
| 3,714,462 | 1/1973 | Blackmer | 307/229 |
| 3,790,819 | 2/1974 | Chamran | 328/145 |
| 3,967,105 | 6/1976 | Harrington | 328/145 |

OTHER PUBLICATIONS

Op Amps Generale Precision Staircase by Gerald Graeme, Electronics 1/72, p. 58.

Primary Examiner—Stanley D. Miller, Jr.
Assistant Examiner—B. P. Davis
Attorney, Agent, or Firm—Oblon, Fisher, Spivak, McClelland & Maier

[57] ABSTRACT

The collector of an NPN transistor is connected to the inverting terminal of an operational amplifier to cause a collector current of the NPN transistor to be inverted by the operational amplifier. The combination circuit of the NPN transistor and operational amplifier equivalently works as a PNP transistor.

6 Claims, 10 Drawing Figures

TRANSISTOR CIRCUIT

BACKGROUND OF THE INVENTION

This invention relates to a transistor circuit and in particular to a transistor circuit using a vertical NPN transistor.

In an integrated circuit device in which a desired transistor circuit is constituted by a combination of an NPN transistor and PNP transistor, the NPN transistor is of a vertical transistor and PNP transistor is of a lateral transistor. By controlling the depth of diffusion the base of the NPN transistor can be designed to have a very narrow width of about 0.8 to 1.5 μm, a distance between the emitter and the collector of the NPN transistor. As a result, the cutoff frequency of the vertical NPN transistor has a high value of 200 to 300 MHz and the percentage in which carriers injected into the base are injected into the collector becomes great, representing a current amplification factor hFE of about 100. The base width of the lateral PNP transistor has a great value of about 10 μm, for it is restricted by the precision with which a mask is effected in the manufacture of an integrated circuit. For this reason, the cutoff frequency of the lateral PNP transistor has a low value of several MHz and the percentage in which carriers injected into the base is injected into the collector becomes small, representing a current amplification factor hFE of about 1 to 10. In this way the lateral PNP transistor is very inferior in performance to the vertical NPN transistor and, where an integrated circuit is designed using the PNP transistor, the drawbacks of the lateral PNP transistor present a bar to the realization of a high performance IC device.

SUMMARY OF THE INVENTION

One object of this invention is to provide a transistor circuit which utilizes the performance of an NPN transistor and equivalently works as a PNP transistor.

Another object of this invention is to provide a transistor circuit in which a combination circuit of an NPN transistor and a current inverting amplifier circuit connected to the NPN transistor to invert the collector current of the NPN transistor is built, as a PNP transistor, into a voltage controlled amplifier of a dbx noise reduction circuit.

According to this invention there is provided a transistor circuit in which a current inverting amplifier circuit is connected to the collector of an NPN transistor and a combination circuit of the NPN transistor and current inverting amplifier circuit equivalently works as a PNP transistor by inverting the collector current of the NPN transistor.

DETAILED DESCRIPTION OF THE PREFERRED EMBODIMENTS

Figure 1A:
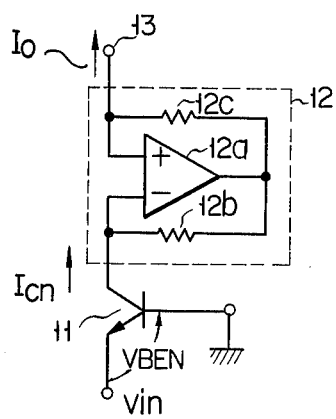
FIG. 1A shows a transistor circuit according to one embodiment of this invention in which a base-grounded NPN transistor is used.

In FIG. 1A the collector of a base grounded NPN transistor 11 is connected to a current inverting amplifier circuit 12. The current inverting amplifier circuit 12 comprises an operational amplifier 12a having an inverting input terminal connected to the collector of the NPN transistor 11, a first impedance element, for example resistor 12b connected between the output terminal and the inverting input terminal of the amplifier 12a, and a second resistor impedance element, for example 12c connected between the noninverting input terminal and the output terminal of the amplifier 12a. Now compare a circuit in FIG. 1A with a PNP transistor 11B in FIG. 1B.

Figure 1B:
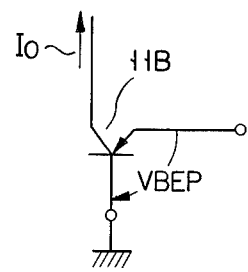
FIG. 1B shows a transistor circuit, equivalent to that of FIG. 1A, which works as a PNP transistor.

With the voltage and current direction as indicated in FIGS. 1A and 1B the following equations will be established:

$$I_{cp} = I_s[\exp(q/KT)(-V_{BEP})-1] \quad (1)$$

$$I_{cn} = -I_s[\exp(q/KT)V_{BEN}-1] \quad (2)$$

where $I_{cp}$ = the collector current of the PNP transistor 11B $I_{cn}$ = the collector current of the NPN transistor 11

$V_{BEP}$ = the base-emitter voltage of the PNP transistor 11B $V_{BEN}$ = the base-emitter voltage of the NPN transistor 11

Suppose $V_{BEN} = -V_{BEP}$, the collector current of the NPN transistor, $I_{cn}$, is a mere inversion of the collector current of the PNP transistor, $I_{cp}$. Therefore, the phase inversion of current is effected by the current inverting circuit 12 which comprises the resistors 12b and 12c and operational amplifier 12a. Since in actual circuit an output terminal 13 is connected to an impedance, a positive feedback to the noninverting input terminal of the operational amplifier 12a is always smaller than a negative feedback to the inverting input terminal of the operational amplifier 12a, and the operational amplifier 12a always works as a negative feedback amplifier. For this reason, no slight error voltage exists between the inverting input terminal and the noninverting input terminal of the amplifier 12a. If the resistors 12b and 12c are equal to each other, a substantially equal current flows through the resistors 12b and 12c and in consequence $I_o = -I_{cn} = I_{cp}$. As a result, the transistor circuit in FIG. 1A equivalently works as a PNP transistor. If the gain of the current inverting amplifier circuit 12 is completely unity, the current gain of the whole circuit in FIG. 1A becomes unity, since a base-grounded current gain is substantially close to unity. If the current gain of the current inverting amplifier circuit 12 is selected to be 100, the circuit in FIG. 1A equivalently works as an emitter-grounded PNP transistor where a current amplification factor hFE = 100.

Figure 2A:
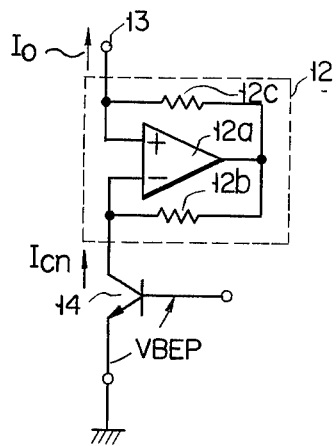
FIG. 2A shows a transistor circuit according to another embodiment of this ivention which uses an emitter-grounded NPN transistor.
Figure 2B:
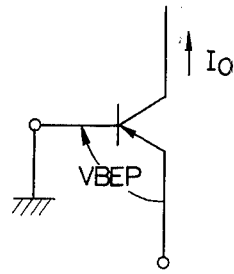
FIG. 2B shows a transistor circuit, equivalent to that of FIG. 2A, which works as a PNP transistor.

FIG. 2A shows a transistor circuit in which the current inverting circuit 12 is connected to an emitter-grounded NPN transistor 14. In this case, the transistor circuit equivalently works as a base-grounded PNP transistor shown in FIG. 2B.

Figure 3:
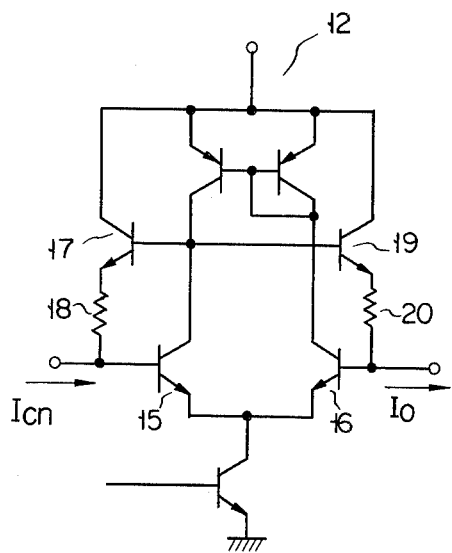
FIG. 3 is a modified form of a current inverting amplifier circuit.

The above-mentioned current inverting amplifier circuit 12 can be constructed as shown in FIG. 3. The current $I_{cn}$ is supplied to the base of one (for example, transistor 15) of differential type transistors 15 and 16 constituting a current mirror and the current $I_o$ is taken from the base of the other transistor 16. The collector output of the transistor 15 is connected through a series circuit of a transistor 17 and resistor 18 to the base of the transistor 15 and through a series circuit of a transistor 19 and resistor 20 to the base of the transistor 16.

Figure 4:
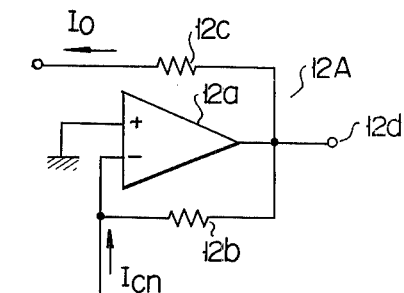
FIG. 4 is a detailed circuit of a current inverting amplifier circuit.

The current inverting amplifier circuit 12 may be constructed as a circuit 12A shown in FIG. 4. In the circuit shown in FIG. 4 the output of the operational amplifier 12a is connected through a resistor 12b to the inverting terminal of the operational amplifier and a noninverting terminal of the operational amplifier 12a is grounded. The noninverting input terminal of the operational amplifier 12 is connected to the collector of an NPN transistor 11. In this transistor circuit a voltage supplied to the output terminal 13 must be clamped. The collector of the NPN transistor 11 connected to the current inverting amplifier circuit 12A becomes a negative potential.

When in the transistor circuit in FIG. 4 a voltage $V_{in}$ is applied to the base of the transistor 11, a collector current $I_{cn}$ flows to the inverting terminal of the operational amplifier. Since the collector current flows through the resistor 12b, a voltage $V_o$ on an output terminal 12d of the operational amplifier 12a becomes $I_{cn} \times R$. If a voltage on the output terminal 13 is at a zero level, an electric current through a resistor 12c becomes $V_o/R = I_{cn} \cdot R/R = I_{cn}$ which is equal to an input current. In consequence, the circuit 12 of FIG. 4 is operated in the same way as the current inverting amplifier circuit shown in FIGS. 1A and 2A. Since in the circuit shown in FIG. 4 no positive feedback is applied to the noninverting terminal of the operational amplifier, a relatively stable operation is obtained.

Figure 5:
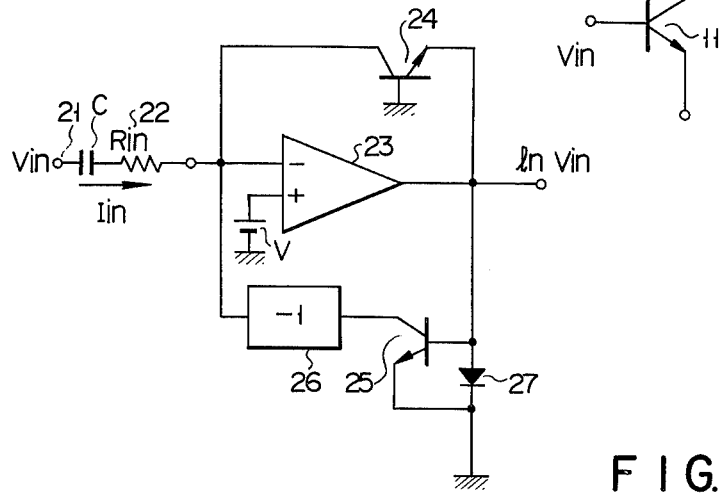
FIG. 5 shows a transistor circuit in which the current inverting amplifier circuit is built into a bidirectional logarithmic amplifier circuit.

When this invention is applied to a bidirectional logarithmic amplifier circuit for generating an output corresponding to the logarithmic value of the input voltage according to the polarity of an input voltage as shown in FIG. 5, a logarithmic amplifier circuit having excellent characteristics is obtained. An input voltage $V_{in}$ is supplied through a capacitor C and a resistor 22 to the inverting input terminal of an operational amplifier 23. The output of the operational amplifier 23 is fed back to the inverting input terminal of the operational amplifier through an emitter-collector path of a base-grounded NPN transistor. The output of the operational amplifier is connected to the inverting input terminal of the operational amplifier 23 through a base-collector path of an NPN transistor 25 and the current inverting amplifier circuit 26. The NPN transistor 25 has an emitter grounded. The noninverting input terminal of the operational amplifier is grounded through a bias voltage source $V_c$ and a forward diode 27 is connected between the base and the emitter of the NPN transistor 25. The transistors 24 and 25 have the same characteristics.

In the circuit shown in FIG. 5 the following equation as explained in connection with FIG. 1A is established between the collector current $I_c$ and a voltage $V_{BE}$ across the base-emitter path of the transistors 24 and 25.

$$I_c = Is(exp(qV_{BE}/KT) - 1) \tag{2a}$$

In consequence, an electric current proportional to a voltage $V_{in}$ applied to an input terminal 21 flows through the capacitor C and resistor 22 to the inverting input terminal of the operational amplifier 23. This current, collector current of the NPN transistor 24 provided at the feedback path of the operational amplifier 23 and collector current of the transistor 25 as inverted by the current inverting amplifier circuit cancel each other with the result that the input current is made equal to the collector current.

Thus, the above-mentioned equation (2a) will be $$I_c = V_{in}/R_{in} = Is(exp(qV_{BE}/KT) - 1) \tag{3}$$

Taking a logarithm with respect to both the terms of the equation and eliminating a second term on the right band of the equation yields $$lnV_{in} = \{ln(R_{in} \cdot Is) \cdot q/KT\}V_{BE} \tag{4}$$

The output voltage is the logarithm of the input voltage.

Since in the above-mentioned logarithmic amplifier circuit the PNP transistor is equivalent to a combination with the NPN transistor 25 and current inverting amplifier circuit 26, an output voltage having excellent symmetry is obtained. The diode 27 in FIG. 5 is inserted to make the current gain of the NPN transistor equal to the current gain of the equivalent PNP transistor and it bears no relation to the essential operation of the circuit in FIG. 5.

Figure 6:
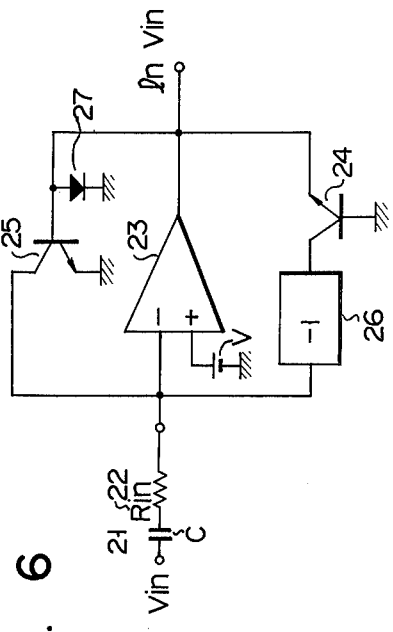
FIG. 6 is a transistor circuit in which the current inverting amplifier circuit is connected to a base-grounded NPN transistor.

FIG. 6 shows a logarithmic amplifier circuit in which a current inverting amplifier circuit 26 is inserted at the side of the base-grounded NPN transistor. The logarithmic amplifier circuit shown in FIG. 6 is operated in the same way as the circuit shown in FIG. 5. Because in the circuit shown in FIG. 6 a current inverting amplifier circuit 26 having a poor frequency characteristic is connected to a base-grounded transistor 25 of a better frequency characteristic than that of an emitter-grounded NPN transistor 24, a balanced frequency characteristic is obtained between the emitter-grounded NPN transistor 24 and an equivalent PNP transistor circuit constituted by a combination circuit of the current inverting amplifier circuit 26 and base-grounded NPN transistor 24. For this reason, the circuit shown in FIG. 6 has a better frequency characteristic than that of the circuit shown in FIG. 5.

Explanation will be made of an embodiment in which the equivalent PNP transistor formed of the combination circuit of the above-mentioned current inverting amplifier circuit and NPN transistor is applied to a voltage controlled amplifier in dbx noise reduction device disclosed in U.S. Pat. No. 3,789,143.

Figure 7:
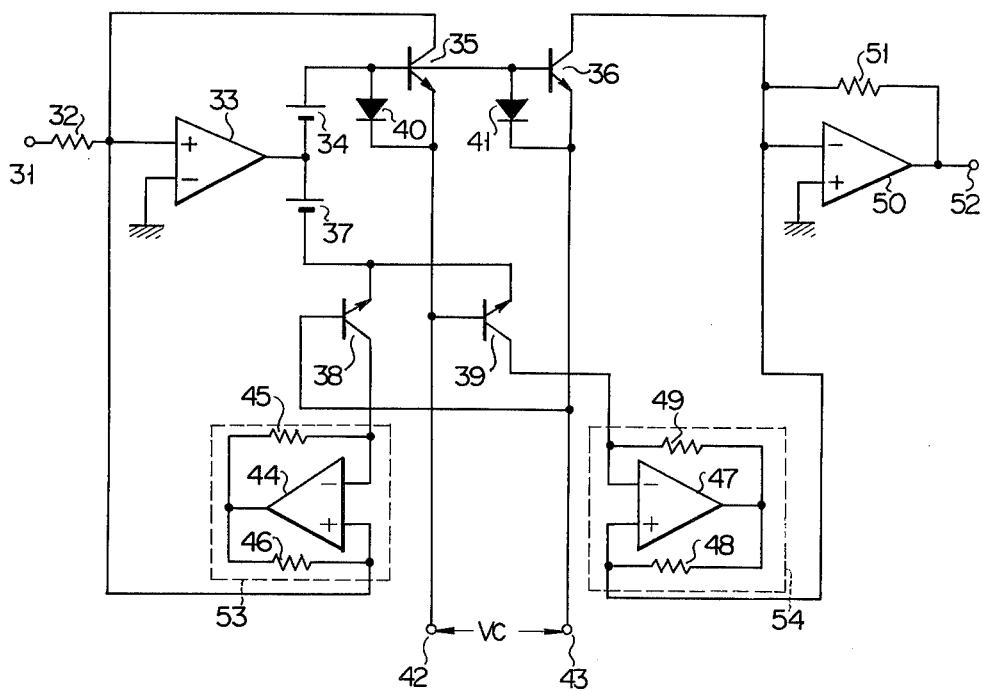
FIG. 7 is a transistor circuit in which the current inverting amplifier circuit is built into a voltage controlled amplifier of dbx noise reduction circuit.

In FIG. 7 an input terminal 31 is connected through a resistor 32 to the noninverting input terminal of a first operational amplifier 33. The inverting input terminal of the first operational amplifier 33 is grounded. The output of the operational amplifier 33 is connected through a first D.C. power source 34 to the base of NPN transistors 35 and 36 and through a second D.C. power source 37 to the emitter of NPN transistors. A diode 40 is connected between the base and the emitter of the transistors 35 and 36 and a diode 41 is connected between the base and the emitter of the transistor 36. The emitter of the transistor 35 is connected, together with the base of the transistor 39, to a control terminal 42 and the emitter of the transistor 36 is connected, together with the base of the transistor 38, to a control terminal 43. A control signal $V_c$ is applied between the control terminals 42 and 43. In this circuit arrangement a bias voltage for biasing, in addition to a control signal component, at least a synchronizing signal component somewhat negative is necessary. Otherwise, the collector-emitter voltage of the transistors becomes zero and no normal operation is effected. This problem is setted by biasing a potential on the noninverting input terminal of the operational amplifier 33 and fourth operational amplifier 50 somewhat more positive than a ground potential. In this case, an in-phase voltage of a zero level can be applied to the controlled terminals 42 and 43 or a control voltage can be applied to one of the control terminals 42 and 43 with the other control terminal grounded. The collector of the transistor 38 is connected to the inverting input terminal of a second operational amplifier 44 and a resistor 45 is connected between the output terminal and the inverting input terminal of the second operational amplifier 44. The output terminal of the operational amplifier 44 is fed back to the noninverting input terminal of the operational amplifier 44 through a resistor 46 and connected to the noninverting terminal of the operational amplifier 33 and to the collector of the transistor 35. The collector of the transistor 39 is connected to the inverting input terminal of a third operational amplifier 47. A resistor 48 is connected between the output terminal and the noninverting input terminal of the operational amplifier 47 and a resistor 49 is connected between the inverting input terminal and the output terminal of the operational amplifier 47. The noninverting terminal of the amplifier 47 is connected to the collector of the transistor 36 and to the inverting input terminal of the fourth operational amplifier. The noninverting input terminal of the operational amplifier 50 is grounded and the output terminal of the operational amplifier 50 is fed back to the inverting input terminal through a resistor 51. When an input signal ei is supplied to the input terminal 31, an output voltage eo is taken from an output terminal of the operational amplifier 50. In the circuit arrangement shown in FIG. 7 the operational amplifier 44 and resistors 45 and 46 constitutes a first current inverting circuit 53, and a combination circuit of the inverting circuit 53 and NPN transistor 38 works as a first equivalent PNP transistor. Likewise, the operational amplifier 47 and resistors 48 and 49 constitutes a second current inverting circuit 54 and a combination circuit of the inverting circuit 54 and NPN transistor 39 works as a second equivalent PNP transistor.

In FIG. 7 the phase of a voltage $V_{BE}$ between the base and emitter of the transistor 35 is reversed by reversing the emitter-base connection of the transistors 35 and 38. That is, a control voltage is applied to the base of the transistor 38 through the terminal 43 and the output of the operational amplifier 33 is applied to the emitter of the transistor 38, whereas the output of the operational amplifier 33 is applied to the base of the transistor 35 and a control signal is applied to the emitter of the transistor 35 through the terminal 42. It is preferred that the output impedance of the operational amplifier 33 be high from the standpoint of the operation of the circuit in FIG. 7. In this case the transistors 35 and 36 show an extremely higher operation impedance than that of the transistors 38 and 39 and, in order to obtain a balance of impedance, diodes 40 and 41 are provided. Since the diodes 40 and 41 usually utilizes the base-collector path of a transistor having the same characteristic as the transistors 35 and 36, the current amplification factor of the transistors 35 and 38 seemingly becomes unity. A gain controlled voltage $V_c$ energizes the emitter of the transistors 35 and 36 and therefore it is necessary to use a gain controlled voltage source having a sufficiently low impedance. As such voltage source use may be made of a negative feedback amplifier. According to this invention the combination of the NPN transistor and current inverting amplifier, which works as the equivalent PNP transistor, is applied to the voltage controlled circuit in the dbx noise reduction device without using the above-mentioned lateral PNP transistor. Therefore, the voltage controlled circuit can avoid the lowering of characteristic as resulting from the poor characteristic of the lateral PNP transistor and be constructed in the IC form, thus easily obtaining the uniformity of the characteristics of circuit elements as well as the thermal coupling. As a result, it is possible to prevent the worsening of high harmonic distortion.

The other embodiment of the voltage controlled circuit to which this invention is applied will be explained by referring to FIG. 8.

Figure 8:
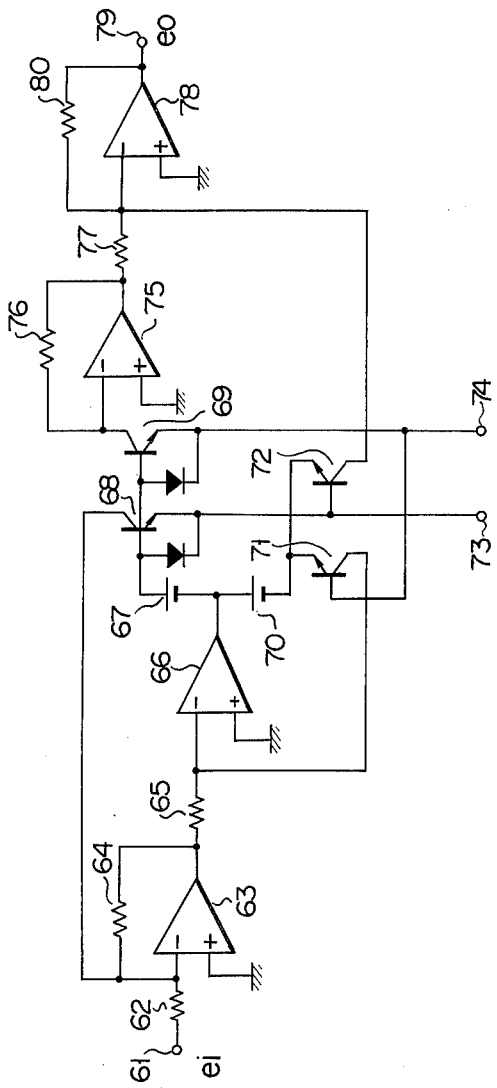
FIG. 8 is a transistor circuit in which the current inverting amplifier circuit is applied to the other voltage controlled amplifier of the dbx noise reduction circuit.

In FIG. 8 an input signal ei is supplied to an input terminal and then through a resistor 62 to the inverting input terminal of a first operational amplifier 63. The noninverting input terminal of the operational amplifier 63 is grounded and the output terminal of the operational amplifier 63 is fed back to the inverting input terminal 12 of the operational amplifier 63 through a resistor 64. The output of the operational amplifier 63 is connected through a resistor 65 to the inverting input terminal of a second operational amplifier. The noninverting input terminal of the second operational amplifier 66 is grounded and the output of the second operational amplifier 66 is coupled through a D.C. power source 67 to the base of NPN transistors 68 and 69 and through a D.C. power source 70 to the emitter of NPN transistors 71 and 72. A diode 73 is connected between the emitter and base of the transistor 68 and a diode 74 is connected between the emitter and base of the transistor 69. The emitter of the transistor 68 is connected to the base of the transistor 72 and to a control terminal 73, and the emitter of the transistor 69 is connected to the base of the transistor 71 and to a control terminal 74. The collector of the transistor 68 is connected to the inverting input terminal of the first operational amplifier 63 and the collector of the transistor 71 is connected to the inverting input terminal of the second operational amplifier. The collector of the transistor 69 is connected to the inverting input terminal of a third operational amplifier 75 and the noninverting input terminal of the third operational amplifier 75 is grounded. The output terminal of the third operational amplifier 75 is fed back to the inverting input terminal of the operational amplifier 75 through a resistor 76. The output terminal of the third operational amplifier 75 is connected through a resistor 77 to the collector of the transistor 72 and to the inverting input terminal of a fourth operational amplifier 78. The noninverting input terminal of the fourth operational amplifier is grounded and the output terminal of the fourth operational amplifier is fed back to the inverting input terminal of the fourth operational amplifier through a resistor 80.

When an input signal ei is supplied to the input terminal 61 of the voltage controlled circuit in FIG. 8, an output signal eo corresponding to the input signal emerges from an output terminal 79.

Even when the input signal is supplied to the inverting input terminal of the operational amplifier connected to the collector of the NPN transistor, the same effect as in FIG. 7 will be obtained.

What we claim is:

1. A transistor circuit including an equivalent PNP transistor circuit comprising at least one NPN transistor and a current inverting amplifier connected to a collector of the NPN transistor for inverting a collector current of the NPN transistor and including an operational amplifier having an inverting input terminal connected to the collector of the NPN transistor, a noninverting terminal connected to a predetermined potential point and an output terminal, a first impedance element connected between the inverting input and output terminals of the operational amplifier, and a second inpedance element connected between the output terminal of the operational amplifier and a point having a potential equal to the predetermined point.

2. A transistor circuit according to claim 1 which further includes a logarithmic amplifier between the input and output terminals to which the equivalent PNP transistor circuit is connected.

3. A transistor circuit including an equivalent PNP transistor circuit comprising at least one NPN transistor and a current inverting amplifier circuit connected to a collector of the NPN transistor for inverting a collector current of the NPN transistor and including an operational amplifier having an inverting input terminal connected to the collector of the NPN transistor, a noninverting terminal and an output terminal, a first impedance element connected between the inverting input and output terminals of the operational amplifier and a second impedance element connected between the noninverting input and output terminals of the operational amplifier.

4. A transistor circuit according to claim 3 which further includes a logarithmic amplifier between the input and output terminals to which the equivalent PNP transistor circuit is connected.

5. A transistor circuit comprising a first operational amplifier for amplifying an input signal; a first NPN transistor having a base connected to the output terminal of said first operational amplifier and a collector connected to an input terminal of said first operational amplifier; a second NPN transistor having a base connected to said operational amplifier; third and fourth NPN transistors the emitters of which are connected to an output terminal of said amplifier; a first current inverting amplifier circuit including a second operational amplifier having an inverting input terminal connected to the collector of said third NPN transistor and adapted to invert a collector current of said third NPN transistor for supply to said first operational amplifier; a second current inverting amplifier circuit including an inverting input terminal connected to the collector of said fourth NPN transistor and adapted to invert a collector current of said fourth transistor; means for supplying a gain controlled voltage between the emitters of said first and second NPN transistors and between the bases of said third and fourth transistors; and circuit means for synthesizing and amplifying a collector output of said second transistor and an output of said second current inverting amplifier circuit, in which a combination circuit of said third NPN transistor and said first current inverting amplifier circuit works as one PNP transistor and a combination circuit of said fourth NPN transistor and said second current inverting amplifier circuit works as the other PNP transistor.

6. A transistor circuit comprising a first operational amplifier for amplifying an input signal; a second operational amplifier for amplifying an output of said first operational amplifier; a first NPN transistor having a base connected to an output of said second operational amplifier and a collector connected to an input of said first operational amplifier; a second NPN transistor having a base connected to the output of said second operational amplifier; a third NPN transistor having an emitter connected to the output of said operational amplifier and a collector connected to an inverting input terminal of said second operational amplifier; a fourth NPN transistor having an emitter connected to an output terminal of said second operational amplifier; a third operational amplifier having an inverting input terminal connected to the collector of said second transistor and adapted to invert a collector current of said second transistor; amplifying circuit means for synthesizing and amplifying an output of said third operational amplifier and a collector current of said fourth transistor; and means for supplying a gain controlled voltage between the emitters of said first and second transistors and between the emitters of said third and fourth transistors.

* * * * *